United States Patent [19]

Fujita

[11] Patent Number: 4,620,655
[45] Date of Patent: Nov. 4, 1986

[54] APPARATUS FOR SUPPLYING TAPED PARTS

[75] Inventor: Yasuhiro Fujita, Yokosuka, Japan

[73] Assignee: Hitachi, Ltd., Tokyo, Japan

[21] Appl. No.: 736,150

[22] Filed: May 20, 1985

[30] Foreign Application Priority Data

May 21, 1984 [JP] Japan .................. 59-100558

[51] Int. Cl.[4] ............... B65H 20/00; H05K 13/02; H05K 3/00
[52] U.S. Cl. ........................... 226/109; 29/825; 29/829; 221/186; 221/197; 221/210; 226/115; 226/120
[58] Field of Search ............... 226/109, 108, 96, 111, 226/112, 115–117, 120; 221/210, 186, 211, 187, 27–29, 197; 29/829, 825, 842

[56] References Cited

FOREIGN PATENT DOCUMENTS 46659 4/1978 Japan .
79467 6/1979 Japan .
118698 9/1980 Japan .
39599 3/1982 Japan .

Primary Examiner—John Petrakes
Attorney, Agent, or Firm—Antonelli, Terry & Wands

[57] ABSTRACT

An apparatus for use in a system for mounting taped electronic parts on a predetermined portions of ceramics substrates and adapted for supplying the parts to a predetermined portion of the system. The apparatus has a slide table equipped with a tape pay-off arrangement and a tape feeding arrangement, a slide table and a power transmission interposed between a stationary table and the slide table, with the power trnsmission means being capable of transmitting a power to the tape feeding arrangement even during the sliding of the slide table. A switch-over device is drivingly connected to the power transmission means and is adapted for selectively transmitting the power to the tape feeding arrangement, in such a manner that both the selecting operation for selecting the part to be mounted next and the part feeding operation for feeding the part are conducted simultaneously.

2 Claims, 6 Drawing Figures

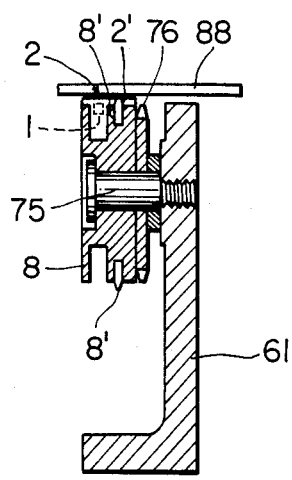
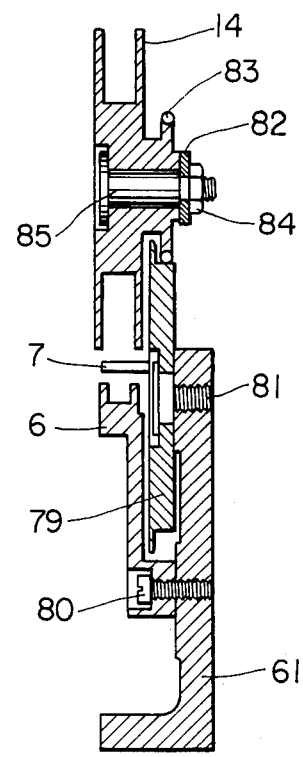
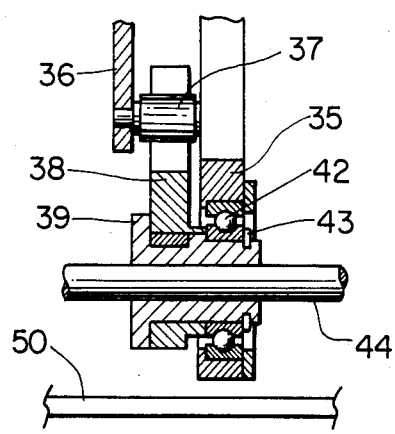

APPARATUS FOR SUPPLYING TAPED PARTS

BACKGROUND OF THE INVENTION

The present invention relates to a system for mounting taped electronic parts on predetermined portions of a printed circuit board or a ceramics substrate and, more particularly, to an apparatus for use in such a system and adapted for supplying the taped parts.

Japanese Patent Laid-Open No. 118698 discloses a part mounting system which is composed mainly of a taped part supplying apparatus, an X-Y table apparatus and a suction head apparatus serving as a part transferring and mounting apparatus acting between the taped part supplying apparatus and the X-Y table apparatus.

A plurality of tapes are arrayed on a slide table in a direction y such as to extend in a direction x orthogonal to the direction y. Different tapes carry different electronic parts: namely, each tape carries a plurality of the same electronic parts bonded thereto at a constant pitch, with each tape being perforated at a constant pitch along one longitudinal edge thereof. In order to prevent the electronic parts from coming off, an upper tape is adhered to each tape.

The operation of this part mounting system is as follows.

First of all, a part selecting operation is conducted by sliding a slide table in the direction y so as to bring the tape carrying the part to be mounted into alignment with the suction head such that the part is located at a position which is spaced by one pitch from a predetermined position which is immediately below the suction head. After the completion of this part selecting operation, the tape carrying the selected part is fed by one pitch by the operation of a ratchet wheel. After this feeding operation, the suction head, which has been stationed above the selected and fed part is lowered to draw and catch the part. The sucking head thus holding the part is then lifted and moved thus completing the suction operation. On the other hand, the X-Y table of the X-Y table apparatus is slid in the X- and Y-directions to bring the aimed portion of the substrate where the part is to be mounted to the position immediately under the part held by the suction head, thus completing the locating operation. After the completion of this locating operation, the suction head stationed immediately above the aimed portion of the substrate is lowered to mount the part on the aimed portion of the substrate and lifted again and moved in the X-direction thus completing the mounting operation.

Thus, the conventional part mounting system performs a sequential operation including the selection of parts, feeding of parts, drawing of the parts, locating and then mounting, thereby mounting various electronic parts on predetermined portions of the substrates.

This conventional system, however, is not designed to achieve a higher efficiency of the mounting work by simultaneously conducting both the selection of parts and the feeding of the parts. This inconveniently hinders the high speed operation of the part mounting system.

Accordingly, an object of the invention is to provide an apparatus for supplying taped parts capable of operating at a high speed, thereby overcoming the above-described problems of the prior art.

To this end, according to the invention, there is provided an apparatus for supplying taped electronic parts to predetermined portions of substrate, the apparatus having a slide table equipped with a tape pay-off means and a tape feeding means, a slide table slide means and a power transmission means interposed between a stationary table and the slide table, the power transmission means being capable of transmitting a power to the tape feeding means even during the sliding of the slide table, and a switch-over means drivingly connected to the power transmission means and adapted for selectively transmitting the power to the tape feeding means, in such a manner that both the selecting operation for selecting the part to be mounted next and the part feeding operation for feeding the part are conducted simultaneously.

The above and other objects, features and advantages of the invention will become clear from the following description of the preferred embodiments when the same is read in conjunction with the accompanying drawings.

BRIEF DESCRIPTION OF THE DRAWINGS

FIG. 2 is a sectional view of a part of the apparatus taken along the line II—II of FIG. 1;

FIG. 3 is a sectional view of a part of the apparatus taken along the line III—III of FIG. 1;

FIG. 4 is a sectional view of a part of the apparatus taken along the line IV—IV of FIG. 1;

DETAILED DESCRIPTION

Figure 1:
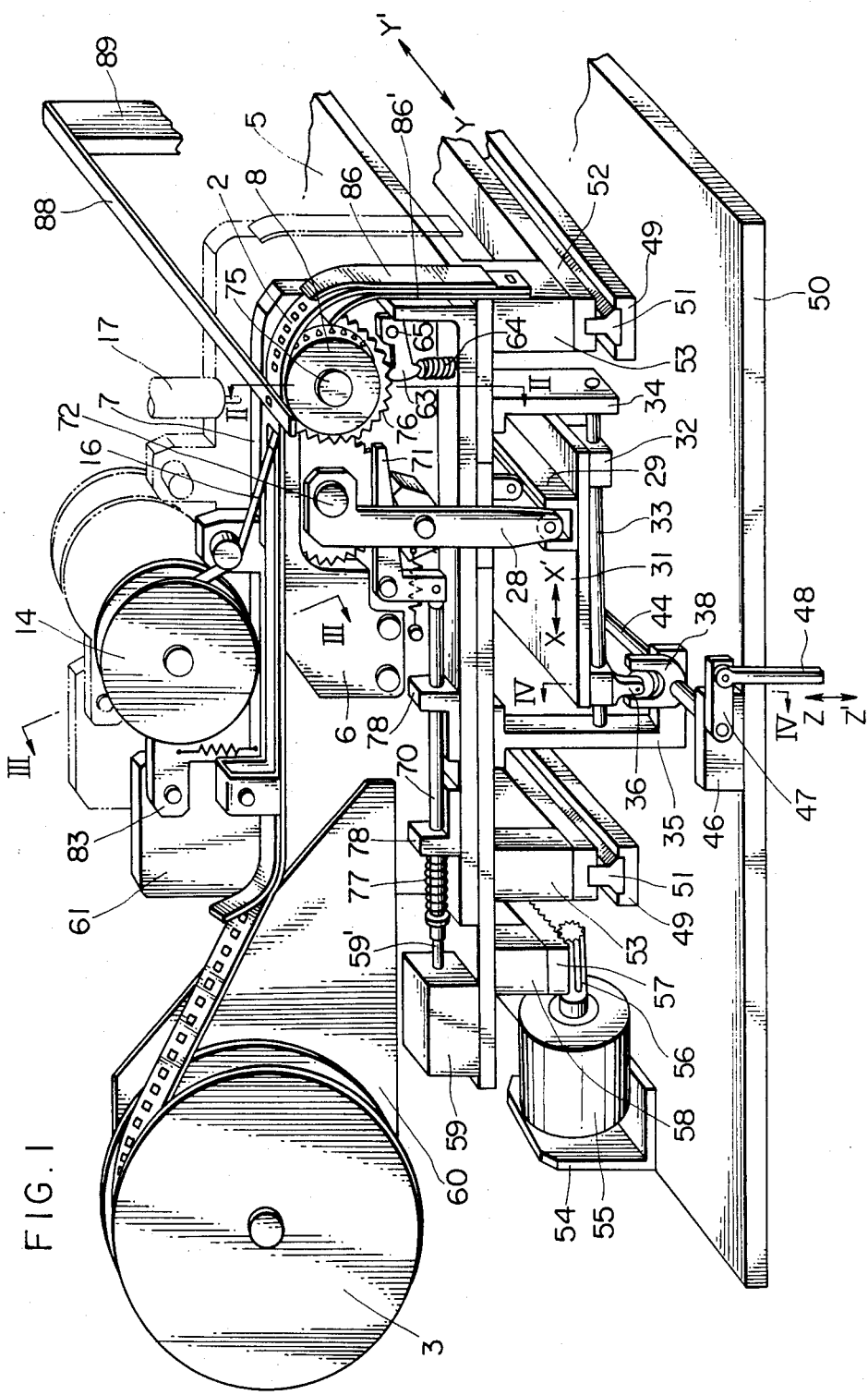
FIG. 1 is a perspective view of an embodiment of the apparatus of the invention for supplying taped parts.
Figure 5:
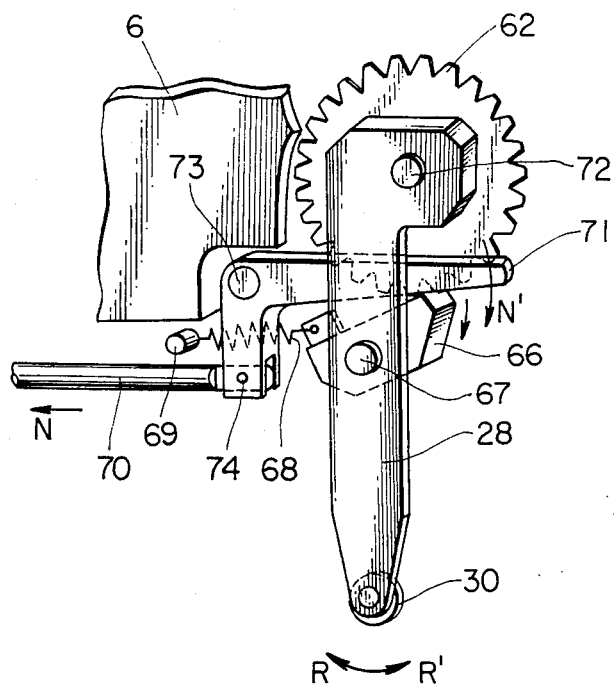
FIG. 5 is a perspective view of a part of the apparatus, showing in particular a second power transmission means in the state out of engagement.
Figure 6:
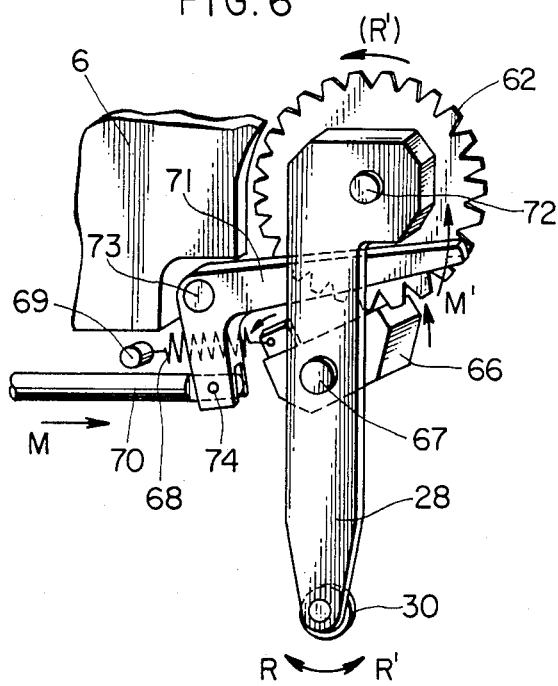
FIG. 6 is a perspective view of a part of the apparatus, showing in particular the second power transmission means in the engaging state.

Referring now to the drawings wherein like reference numerals are used throughout the various views to designate like parts and, more particularly, to FIGS. 1-6, according to these figures, an apparatus for supplying taped parts includes a slide table 5 mounted for sliding motion in the direction Y—Y' on a stationary table (including a base) 50 along rails 49 and 51 disposed on a stationary table 50 so as to extend in the direction of arrows Y—Y'. A beam 52, fixed to the underside of the slide table 5 through a bracket 53, slidably engages the rail 51.

A motor 55 is mounted on the stationary table 50 through a bracket 54, with a pinion 56 being attached to the end of the rotor shaft of the motor 55. A rack 57 is secured to the underside of the slide table 5 through a bracket 58 so as to extend in the same direction as the beam 52, i.e., in the direction Y—Y'. The aforementioned pinion 56 meshes with this rack 57 so that the slide table 5 slides in the direction Y—Y' as the motor 55 operates. The motor 55, pinion 56 and rack 57 constitute a table slide means.

A plurality of L-shaped frames 61 are fixed to the upper surface of the slide table 5 and are arrayed in the direction Y—Y'. A bracket 60 which rotatably carries a reel 3 is secured to each bracket 60. A grooved plate 6 and a mounting plate 79 are attached to the frame 61 by screws 80 and 81. A retainer plate 7 is secured to the mounting plate 79, with the grooved plate 6 and the retainer plate 7 being arranged to oppose each other such as to extend in the direction orthogonal to the direction Y—Y'. With this arrangement, the tape 2 including the parts 1 and the upper tape 16 is fed from the reel 3 in the direction orthogonal to the sliding direction Y—Y' of the slide table 5 through the clearance between the grooved plate 6 and the retainer plate 7. The reel 3, grooved plate 6 and the retainer plate 7 constitute a tape pay-off means.

The frame 61 pivotally carries one end of the lever 83, while the other end of the lever 83 rotatably carries a take-up roller 14 by means of a bolt 85 and a nut 84. A take-up roller 14 is formed as a unit with a pulley 82. The arrangement is such that, when the take-up roller 14 is rotated through a pulley 82 which is conncted to a driving means which is not shown, the upper tape 16 peeled off from the tape 2 is taken up by the take-up roller 14. A pair of guide plates 86 and 86' are fixed to the frame 61, and the tape after the delivery of the parts 1 falls onto the lower portion of the stationary table 50 through the gap between the guide plates 86 and 86'.

The frame 61 rotatably carries a ratchet wheel 8 and the gear 76 by a pin 75. The ratchet wheel 8 and the gear 76 are fixed to each other. A plurality of pins 8' are provided on the outer peripheral surface of the ratchet wheel 8 at a constant pitch. One end of a stopper 63 is rotatably secured to the frame 61 by a pin 65. A compression spring 64 is loaded between the stopper 63 and the frame 61, such that the other end of the stopper 63 is held always in meshing engagement with the teeth of the gear 76. The perforation 2' of the tape 2 paid off from the reel 3 is engaged by the pins 8' of the ratchet wheel 8 so that the tape 2 is fed at a constant pitch in response to an intermittent rotation of the ratchet wheel 8 and the gear 76 by a given angle. As a result of the meshing between the stopper 63 and the gear 76, the tape 2 is stopped correctly at the predetermined position, i.e., at the position where the part 1 carried by the tape is located immediately under a suction head 17. The ratchet wheel 8 and the described associated parts constitute a tape feeding means.

A part retaining plate 88 extending in the direction Y—Y is fixed to a bracket 89 which, in turn, is fixed to the upper side of the stationary table 50. The part retainer plate 88 is provided with an aperture at a portion thereof corresponding to the position of the suction head 17. The retainer plate 88 is intended for preventing the parts 1 from jumping off the tape 2 when the slide table 5 slides in the direction Y—Y' after the peeling from the upper tape 16.

A bracket 46, fixed to the stationary table 50, rotatably carries both ends of a spline shaft 44. One end of an arm 47 is fixed to one end of the spline shaft 44. A rod 48, rotatably secured to the other end of the arm 47, is drivingly connected to the driving system which is not shown. Therefore, as the driving system operates, the rod 48 is reciprocatingly moved in the direction of the arrows Z—Z', while the spline shaft 44 is reciprocatingly rotated forwardly and backwardly through the arm 47. The spline shaft 44, arm 47 and the rod 48 constitute a first power transmission means.

One end of the lever 28 and the gear 62 are rotatably secured to the frame 61 through a pin 72. The lever 28 and the gear 62 are in the freed state so that they can rotate independently. A feeding pawl 66 is rotatably secured to an intermediate portion of the lever 28 by means of a pin 67. A tension spring 68 is stretched between one end of the feeding pawl 66 and a pin 69 provided on the frame 61 so as to always maintain the other end of the feeding pawl 66 in meshing engagement with the teeth of the gear 62. A roller 30 is rotatably secured to the other end of the lever 28. The arrangement is such that, as the other end of the lever 28 is reciprocatingly swung in the directions of the arrows R—R', the gear 62 is allowed to rotate only in the direction of the arrow R' intermittently by a predetermined angle. Namely, a swinging or rocking of the other end of the lever 28 in the direction of the arrow R' causes the gear 62 to rotate in the direction of the arrow R' through the engagement between the feeding pawl 66 and the gear 62, as will be seen from FIG. 6. On the other hand, when the other end of the lever 28 rocks in the direction of the arrow R, the engagement between the feeding pawl 66 and the gear 62 is dismissed so that the gear 62 is left without being rotated. Consequently, the gear 62 rotates intermittently by a predetermined angle only in the direction of the arrow R' in response to the rocking motion of the other end of the lever 28 in the directions of arrows R—R'. Thus, the gear 76 meshing with the gear 62 and, hence, the ratchet wheel 8, integral with the gear 62, are rotated by a predetermined angle, thereby feeding the tape 2 by a constant distance determined by the pitch. The lever 28, gear 62 and the feeding pawl 66 constitute a second power transmission means.

As shown in FIG. 4, a spline nut 39 is fitted around the spline shaft 44 of the first power transmission means so as to be able to slide in the direction of axis of the spline shaft 44 but not rotatably with respect to the latter. A U-shaped arm 38 is fixed to the outer periphery of the spline nut 39. On the other hand, brackets 34 and 35 are fixed to the underside of the slide table 5. As will be seen from FIG. 4, a spline nut 39 is rotatably secured to the bracket 35 through a bearing 42. The spline nut 39 is prevented from axially coming off the bracket 35 by a stopper ring 43. A guide bar 33 is fixed to the brackets 34 and 35 such as to extend in the direction orthogonal to the direction Y—Y' of sliding of the guide bar 33. A slide plate 31 is secured to the guide bar 33 through brackets 32, 36 for sliding motion in the direction of the arrows X—X'. A cam follower 37 attached to the lower end of the bracket 36 engages with the U-shaped arm 38 mentioned before. A block 29, having a substantially U-shaped cross-section is fixed to the upper surface of the slide plate 31 so as to extend in the direction of sliding movement of the slide table 5, i.e., in the direction of arrows Y—Y'. The block 29 is engaged by the roller 30 of the lever 28 of the second power transmission means. The torque of the spline shaft 44 of the first power transmission means is first transmitted spline nut 39 of the third power transmission means and then to the lever 28 of the second power transmission means through the constituents of the third power transmission means such as the U-shaped arm 38, cam follower 37, bracket 36, slide plate 31 and the block 29. When the slide table 5 slides in the direction of the arrows Y—Y', the tape pay-off means, tape feeding means and the first and third power transmission means are slid in the direction of the arrows Y—Y'. In this case, the spline nut 39 of the third power transmission means is slid along the spline shaft 44 of the first power transmission means without making any rotation, so that the torque of the spline shaft 44 is transmitted to the spline nut 39. Consequently, the torque of the spline shaft 44 is transmitted to the spline nut 39 even when the spline nut 39 is slid. Thus, the power of the driving system is transmitted to the ratchet wheel 8 and other members of the tape feeding means, even during the sliding of the slide table 5. The spline nut 39, U-shaped arm 38, cam follower 37, brackets 32, 34, 35, 36, guide bar 33, slide plate 31 and the block 29 constitute a third power transmission means.

An L-shaped lever 71 is rotatably secured at its intermediate bent portion 71 to the frame 61, and one end of the L-shaped lever 71 is positioned on the feeding pawl 66 mentioned before. Two brackets 78 are fixed to the frame 61, with the brackets 78 slidably carrying a bar 70. The L-shaped lever 71 is pivotally secured to one end of the bar 70 through a pin 74, and a compression spring 77 is loaded between the other end of the bar 70 and the bracket 78. A solenoid 59, mounted on the frame 61, has a bar 59' one end of which makes contact with the other end of the bar 70. The arrangement is such that, when the solenoid 59 is not energized, the bar 70 is pulled in the direction of the arrow N by the force of the compression spring 77 so that one end of the L-shaped lever 71 is rotated in the direction of the arrow N' around the pin 73 into contact with the upper surface of the feeding pawl 66. The rotation of the L-shaped lever 71, in turn, causes a rotation of the feeding pawl 66 about the pin 67 in the direction of the arrow, i.e., in the same direction as the rotation of the L-shaped lever 71, overcoming the force of the tension spring 68, so that the feeding pawl 66 is disengaged from the gear 62. Therefore, the gear 62 does not rotate even though the lever 28 reciprocatingly rocks in the direction of arrows R and R'. Consequently, the power of the driving system is not transmitted to the gear 76 nor to the ratchet wheel 8 so that the tape 2 is maintained stationary without being fed.

Conversely, in the energized state of the solenoid 59, the bar 70 is moved in the direction of the arrow M overcoming the force of the compression spring 77, so that one end of the L-shaped lever 71 rotates about the pin 73 in the direction of an arrow M' away from the upper surface of the feeding pawl 66. Consequently, the feeding pawl 66 is rotated about the pin 67 by the force of the tension spring 68 in the direction of the arrow, i.e., in the same direction as the rotation of the L-shaped lever 71, thereby bringing the feeding pawl 66 into engagement with the gear 62. As a result, the lever 28 is made to rock in the direction of the arrows R and R', thereby rotating the gear 62 in the direction of the arrow R' over a predetermined angle. Then, the power of the driving system is transmitted to the gear 76 and the ratchet wheel 8, so that the tape 2 is fed at a predetermined pitch. It is thus possible to determined whether the tape 2 is to be fed or not, regardless of the reciprocating rocking motion of the lever 28 in the directions of arrows R and R'. The solenoid 59, bar 70, compression spring 77 and the lever 71 constitute a switch-over means.

Although the illustrated apparatus has only one suction head 17, the apparatus can have four to eight such suction heads for shortening the operation cycle time. It is to be understood also that the tape pay-off means including the reel 3 and other parts, tape feeding means including the ratchet wheel 8 and other parts, second power transmission means including the lever 28, feeding pawl 66, gear 62 and other parts, and the change-over means including the solenoid 59, bar 70, L-shaped lever 71 and other parts are provided for each of a plurality of kinds of parts 1 to be mounted on the substrate.

The described embodiment of the apparatus of the invention operates in a manner which will be explained hereinunder.

According to the invention, while the suction head 17 is operating so as to mount the part on the substrate held by the X-Y table, the selecting operation for selecting the part 1 to be mounted next through the movement of the slide table 5 in the direction of arrows Y,Y' and the feeding operation for feeding the tape 2 carrying the taped part 1 by rotating the ratchet wheel 8 over a predetermined angle are conducted simultaneously.

More specifically, the operation of the motor 55 causes the slide table 5 to slide in the directions of arrows Y, Y' through the pinion 56 and the rack 57. Then, when the tape carrying the part 1 of the kind to be mounted next has been brought to a position immediately under the sucking head 17 shown by two-dots-and-dash line shown in FIG. 1, the motor 55 is stopped to allow the selection of the part 1.

Simultaneously, the solenoid 59 associated with the part 1 of the kind to be mounted next is energized. As a result, the feeding pawl 66 is brought into engagement with the gear 62, so that a part of the driving power is transmitted to the gear 76 through the first, second and third power transmission means, thereby rotating the ratchet wheel 8 over a predetermined angle. Then, after the feeding of the tape 2 carrying the part 1 of the kind to be mounted next is fed by one pitch, the solenoid 59 is de-energized to allow the feed of the part.

Since the selecting operation for selecting the part to be mounted next and the feeding operation for feeding the part are conducted simultaneously, it is possible to shorten the time required for the apparatus for supplying the taped parts.

Consequently, it is possible to shorten the time required for completing one cycle of operation including the selection of the part, feeding of the part, drawing of the part by the suction head 17, locating of the substrate by the X-Y table, and the mounting of the part on the substrate by the suction head 17, thus allowing a high-speed operation of the part mounting system as a whole.

Since the speedup of the part mounting system is realized without increasing the speed of the part selecting operation and the part feeding operation, the risk of jumping off of the part 1 from the tape 2 is not increased substantially, so that a high reliability of operation is ensured.

After the completion of the part selecting and feeding operations, the suction head 17 operates to draw and catch the part, and the locating operation by the X-Y table apparatus is conducted during the suction operation.

As will be understood from the foregoing description, the taped part supplying apparatus of the invention can perform simultaneously both the selection of the parts and the feeding of the parts, thus allowing a shortening of the time required for the supply of the taped parts and a speedup of the part mounting system as a whole. This remarkable effect can be attained without impairing the stable supply of the parts, because the speed of the part selecting and feeding operations need not be increased.

What is claimed is:

1. An apparatus for supplying taped parts, the apparatus comprising: a plurality of tapes carrying the parts to be mounted on an object; a stationary table; a slide table slidably mounted on said stationary table; a slide table slide means disposed between said slide table and said stationary table; a plurality of tape pay-off means provided on said slide table and adapted for paying off the tapes in the direction orthogonal to the direction of sliding of said slide table; a plurality of tape feeding means corresponding in number to said tape pay-off means and disposed on said slide table, said tape feeding means being adapted to feed, at a constant pitch, said tapes paid-off from said tape pay-off means; power transmission means operatively connected to said tape feeding means and capable of transmitting the power to said tape feeding means even during the sliding of said slide table; a driving system drivingly connected to said power transmission means, and switch-over means corresponding in number to said tape feeding means and said tape pay-off means and drivingly connected to said power transmission means so as to selectively transmit the power to said tape feeding means.

2. An apparatus for supplying taped parts according to claim 1, wherein said power transmission means includes a first power transmission means provided on said stationary table and drivingly connected to said driving system, a second power transmission means provided on said slide table and operatively connected to said tape feeding means, and a third power transmission means disposed between said second power transmission means and said first power transmission means and capable of transmitting the power from said first power transmission means to said second power transmission means even during the sliding of said slide table.

* * * * *